United States Patent [19]

Baron et al.

[11] 4,325,986
[45] Apr. 20, 1982

[54] METHOD FOR CONTINUOUS DEPOSITION BY VACUUM EVAPORATION

[75] Inventors: Bill N. Baron; Richard E. Rocheleau; T. W. Fraser Russell, all of Newark, Del.

[73] Assignee: University of Delaware, Newark, Del.

[21] Appl. No.: 43,317

[22] Filed: May 29, 1979

[51] Int. Cl.³ .................... C23C 13/02; C23C 13/04
[52] U.S. Cl. .................................. 427/74; 427/75; 427/251; 427/255.5
[58] Field of Search ............... 427/251, 255 S, 74, 427/75; 118/718, 715

[56] References Cited

U.S. PATENT DOCUMENTS 4,148,275  4/1979  Benden et al. .................. 118/715

FOREIGN PATENT DOCUMENTS 53-18388  6/1978  Japan .

OTHER PUBLICATIONS

Burton et al., "Formation and Characterization of (CdZn)S Films and (CdZn)S/Cu$_2$S Heterojunctions", Jul. 1, 1977.

Primary Examiner—James R. Hoffman
Attorney, Agent, or Firm—Connolly and Hutz

[57] ABSTRACT

An apparatus to deposit material on a substrate, such as in the making of thin film solar cells, consists of two chambers. A manifold chamber having a plurality of spaced nozzles assures efficient and uniform deposition on a substrate. The rate of depositions is controlled by an orifice in a passageway connecting the manifold chamber to an evaporation chamber.

26 Claims, 2 Drawing Figures

METHOD FOR CONTINUOUS DEPOSITION BY VACUUM EVAPORATION

BACKGROUND OF INVENTION

This invention relates to an apparatus for depositing thin films of material and, in particular, to an apparatus for continuous deposition of thin films by vacuum evaporation. Such apparatus is particularly useful for the continuous manufacture of thin film solar cells.

Thin film solar cells possess many potential advantages for use in converting solar energy to electrical power. Thin film cells employing a film of cadmium sulfide converter and a copper sulfide absorber are flexible, light of weight and can be made with commercially acceptable levels of conversion efficiency. Moreover, as contrasted with silicon PN junction solar cells which must be fabricated by inefficient batch processes, there is considerable promise that thin film solar cells can be commercially manufactured using continuous processing techniques.

A key step in the continuous manufacture of thin film cadmium sulfide solar cells is the vacuum evaporation of the cadmium sulfide collector onto a temperature-controlled moving substrate. In large-scale production, cost considerations require that the cadmium sulfide be substantially uniformly deposited on the substrate with relatively little wastage of the evaporated material. In addition, economic considerations also require that large substrate areas be continuously coated without breaking vacuum. Moreover, the rate of deposition must be controlled in the direction of substrate movement and be uniform perpendicular to this direction in order to obtain the required mechanical and electrical properties in the film. Typical prior art vacuum evaporation arrangements are not well-suited to this task. Such arrangements typically feed a wire or ribbon of the material to be coated to an evaporator. The rate of evaporation is controlled by the evaporator temperature and the rate of wire feed. To obtain uniform deposition coating, the evaporated material is applied through a large area orifice through a relatively long source-to-substrate distance.

Such arrangements are not suitable for the large-scale manufacture of cadmium sulfide solar cells. Cadmium sulfide is a sublimable powder and cannot be readily formed into wire or ribbon. Since cadmium sulfide cannot be fed to the evaporator in the form of a liquid or wire, prior solutions involved loading cadmium sulfide powder, pellets or sintered cakes into crucibles. The need to periodically reload the crucibles either precludes continuous operation or necessitates mechanically complex loading and transfer machinery. Thus, the conventional technique for continuous feed of source material is not easily applicable. Control of evaporation rate from a multitude of crucibles by maintaining the temperature of each crucible is difficult and costly. Thus the conventional technique for rate control is inapplicable. Moreover, systems using large source-to-substrate distances are very wasteful of the evaporated material because much of the material misses the substrate and coats the walls of the chamber.

SUMMARY OF INVENTION

In accordance with the present invention, an apparatus for deposition by vacuum evaporation comprises one or more evaporation chambers connected through a rate control orifice to a manifold comprising an array of small diameter nozzles. The rate control orifice, whose dimensions together with the pressure differential across the orifice, determines the rate at which evaporated material passes from the evaporation chamber to the manifold, and the dimensions and spacings of the nozzles are chosen to achieve efficient utilization of evaporant material and substantially uniform deposition on an adjacent moving substrate. In a preferred embodiment, a plurality of valve connected evaporation chambers are used in order to permit continuous coating from at least one evaporator while the source material in another is replenished.

BRIEF DESCRIPTION OF THE DRAWINGS

The nature, advantages and various additional features of the invention will appear more fully upon consideration of the illustrative embodiments now to be described in detail in connection with the accompanying drawings wherein.

DETAILED DESCRIPTION

Figure 1:
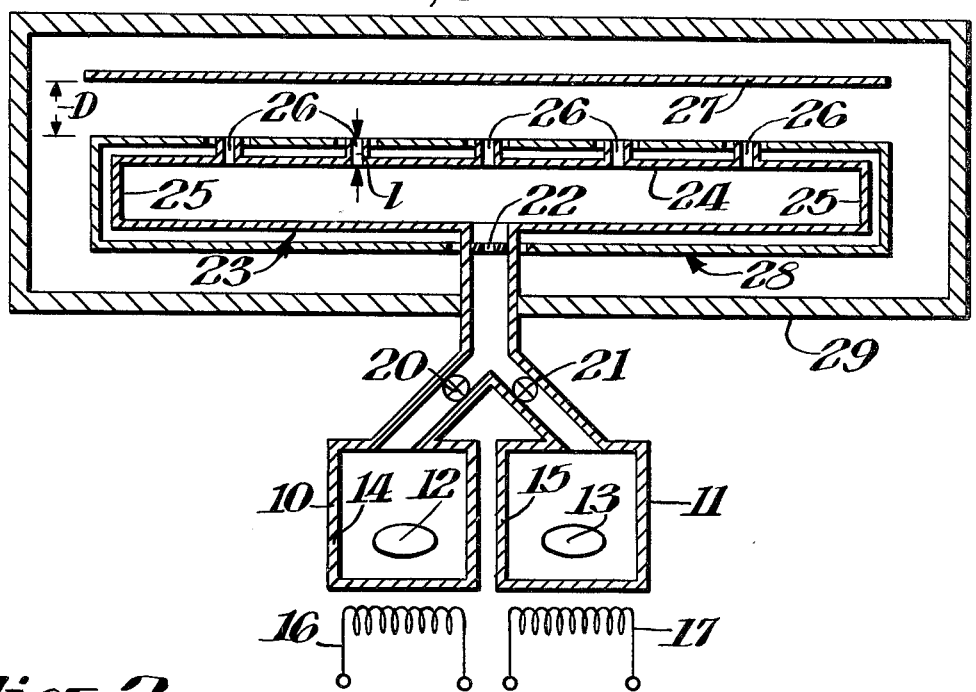
FIG. 1 is a schematic cross section of a preferred vacuum evaporation apparatus in accordance with the invention.
Figure 2:
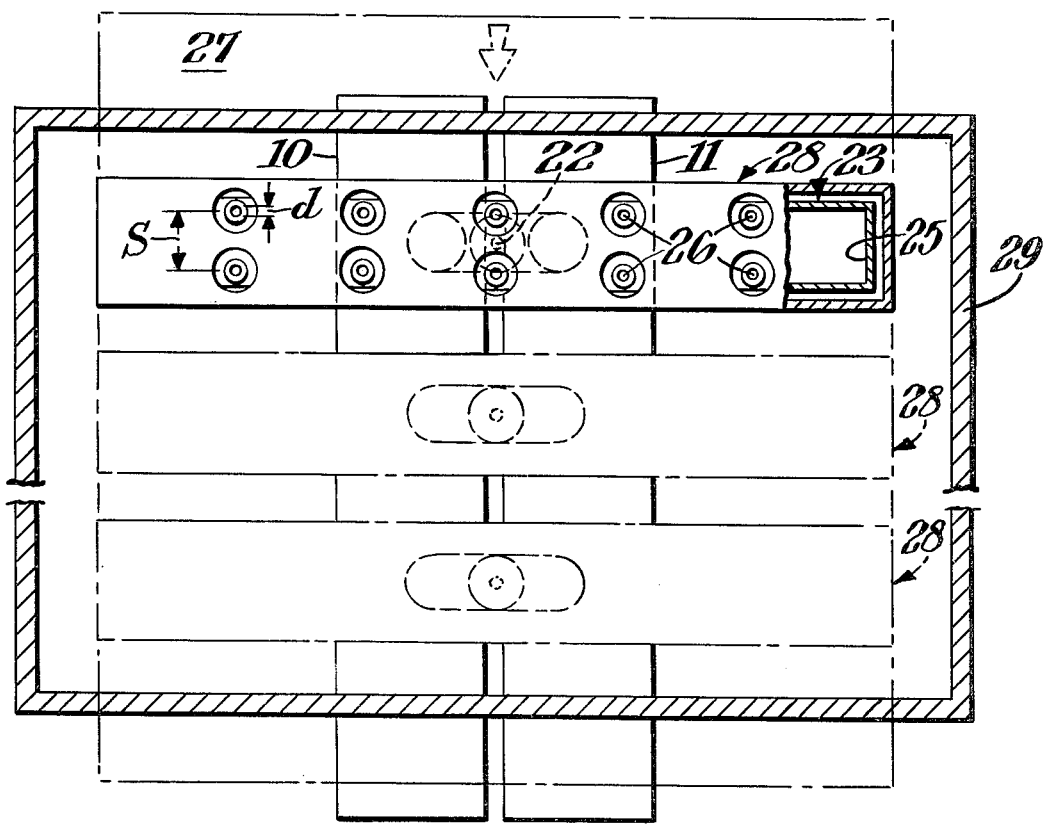
FIG. 2 is a plan view partly in section of the apparatus of FIG. 1.

Referring to the drawings, FIGS. 1 and 2 illustrate a vacuum evaporation apparatus comprising a pair of evaporation chambers 10 and 11 for enclosing respective batches 12 and 13 of material to be evaporated such as cadmium sulfide or zinc cadmium sulfide. The chambers are defined by walls 14 and 15, respectively, and disposed in thermal contact with suitable heating sources 16 and 17 to evaporate the material to be deposited. Removable closures (not shown) are provided to permit loading of source material into the chambers.

Each chamber communicates via conduit having a separately controllable valve 20 and 21, respectively, and a common rate control orifice 22, with a manifold 23. As will be described in greater detail hereinbelow, the area of the opening in orifice 22 can be used to control the rate of effusion of the source material into the manifold.

FIG. 2 illustrates the utilization of a plurality of identical manifolds 23. If desired, however, only a single manifold might be used.

The manifold 23 comprises an open chamber 24 defined by walls 25 having a plurality of nozzles 26 disposed in an array. Preferably a heat shield 28 is disposed about the manifold walls. As will be discussed in greater detail hereinbelow, the nozzle diameter, d, the nozzle length, l, and the center-to-center spacing, s, between adjacent nozzles are chosen to provide a substantially uniform coating upon a moving substrate 27 passing adjacent to the nozzles in a vacuum coating chamber 29 a short distance, D, therefrom.

The drawings illustrate substrate 27 to move transverse to the direction of manifolds 23. If desired, however, substrate 27 may move parallel to manifolds 23.

In a preferred embodiment for depositing cadmium sulfide, the walls defining the evaporation chamber, the communication ducts and the manifold comprise a suitable material meeting the requirements of high temperature durability, chemical inertness, and thermal conductivity and emissivity consistent with efficient heat transfer, such as graphite or boron nitride; and orifice 22 can be made of the same material. The heat shield is comprised of thin foils of chemically inert, high emissivity metals such as tantalum.

In operation, batches of source material are placed in each of the two evaporation chambers and at least one chamber, e.g., 10, is heated to evaporate or sublime the source material and connected to the manifold by opening of its valve 20. The other chamber 11 can be kept in reserve by maintaining valve 21 closed. Evaporated source material passes through orifice 22, at a rate controlled by its diameter and the pressure differential between evaporation chamber 10 and manifold 23, into manifold 23. From the manifold, the evaporated source material passes through nozzles 26 onto the moving substrate where it deposits as a thin film.

As the source material in chamber 10 approaches exhaustion, chamber 11 can be heated and applied to the manifold. Chamber 10 can then be withdrawn from the system by closing valve 20 and its source material can be replenished without breaking vacuum in coating chamber 29.

When the source material is a single species, the rate of effusion E through orifice 22 is approximately given by the relation:

$$E = \frac{aAP}{\sqrt{2\pi MkT}}$$

where A is the orifice area in square centimeters, P is the equilibrium pressure of the species in millimeters of mercury at temperature T, M is the molecular weight of the species, k is Boltzman's constant and a is the effective evaporation coefficient of the species.

In the particular case of cadmium sulfide source material effusing at high rates, the mass effusion rate is more accurately given by the relation:

$$F = \alpha T^{-\frac{1}{2}} KAM'[GP' - G_oP'_o]$$

where K is a correction factor for the decrease in rate due to the finite thickness of the orifice, G is a correction constant for the increase in rate due to intermolecular interactions at elevated pressure; M' is the effective molecular weight of $Cd + S_2$ corrected for non-stoichiometric vapor in the chamber at steady state, P' is the total vapor pressure in the chamber, and $\alpha$ is a constant. The subscript (o) refers to the flow from the manifold back into the evaporation chamber.

Continuous control of rate with a given orifice area is obtained by maintaining a constant pressure difference between evaporation chamber 10 and manifold 23.

In a preferred embodiment the pressure difference is determined by the pressure in chamber 10. The preferred method for controlling rate involves measurement of pressure in chamber 10 by means of a transducer, not shown in FIG. 1, whose electrical output signal, when processed by known electronic means, is proportional to the pressure. The electrical signal equivalent of pressure is further electronically processed to control the heat input to evaporation chamber 10. In another embodiment of the principle of pressure control, automated application and withdrawal of alternating evaporation chambers 11 and 10, upon exhaustion of material in chamber 10 is thereby facilitated. As material in chamber 10 nears exhaustion, the temperature required to maintain the preferred pressure will rise markedly. When the temperature in chamber 10 rises to a predetermined value signaling near exhaustion, a sequence leading to automatic application of chamber 11 to the manifold is initiated. Temperature of the chamber is sensed by a thermocouple or infrared detector.

All of the above rate control and automation benefits made possible by the invention are further enhanced by adaption of techniques and equipment known in the technology of digital process control.

The following tables show design parameters for deposition apparatus in accordance with the invention of dimensions suitable for two different solar cell manufacturing plants. The smaller pilot plant is designed to produce annually a total area of solar cells sufficient to generate 1000 peak kilowatts of electricity. The commercial scale plant is designed to produce annually sufficient area of solar cells capable of generating 10 megawatts of electric power.

Table I shows the basic design parameters used in each plant.

TABLE I

| | | |
|---|---|---|
| Yearly Production (peak solar electric generating capacity at insolation = 0.1 watt/cm², efficiency = 10%) | 1000 KW | 10 MW |
| Production (hrs/yr) | 7200 | 7200 |
| Total Cell Area (m²) | 10,000 | 100,000 |
| Film Thickness (microns) | 10 | 4 |
| Strip Width (m) | 0.25 | 0.50 |
| Linear Velocity (cm/sec) | 0.15 | 0.77 |
| Exposure Time (sec) | 400 | 160 |

Table II details the design specifications and approximate size of the evaporation chamber for each plant.

TABLE II

| | | |
|---|---|---|
| Yearly Production | 1000 KW | 10 MW |
| Operation/Charge (hrs) | 24 | 24 |
| Minimum Sublimation Rate (100% util) (gms/min) | 1.12 | 11.2 |
| Expected Sublimation Rate (80% util) (gms/min) | 1.40 | 14.0 |
| Total Sublimation per 24 hrs (80% until) (kg) | 5.2 | 52 |
| Sublimation Temperature (°K) | 1250-1450 | 1250-1450 |
| Rate Orifice Diameter (mm) | 0.5-3 | 1.-6 |
| Approximate Chamber Size (m³) | 0.06 | 0.6 |
| Approximate CdS Surface Area (cm²) | 260 | 1600 |

Table III gives the nozzle sizes and distribution needed to control uniformity of deposition.

TABLE III

| | | |
|---|---|---|
| Yearly Production | 1000 KW | 10 MW |
| Overall Dimensions | 0.6 m = 0.3 m | 1.2m × 0.6m |
| Temperature (°K) | 1250-1450 | 1250-1450 |
| Number of Nozzles | 4 to 6 rows 3 to 5 noz ea | 8 to 12 rows 6 to 10 noz ea |
| Nozzle Diameter (mm) | 1.3-5.1 | 1.3-5.1 |
| Nozzle Length (mm) | 6.4'13 | 6.4-13 |
| Source to Substrate Distance (mm) | 50-200 | 50-200 |

The following analytical discussion is included for those desiring to use the apparatus in applications different from those described above.

Deposition rates, uniformity of deposition and effectiveness of source utilization can all be calculated from the vapor pressure in the sparger manifold, the mean free path of molecules in the manifold and the nozzle size and location. The proper nozzle geometry and placement to produce uniform film thickness with high source utilization can be obtained by repeated calculations until a design meeting specifications is found. The total deposition at any location on the substrate is the integrated value of the fluxes from each nozzle as the substrate moves through the deposition zone.

The vapor pressure in the sparger manifold P can be measured empirically or calculated.

The mean free path of molecules λ can be calculated from the vapor pressure P and temperature in the manifold T in accordance with the approximate relation:

$$\lambda = \frac{kT}{\pi P D^2 \sqrt{2}}$$

where k is Boltzmann's constant and D is the diameter of the molecules.

The angular distribution of vapor out of the nozzles can be empirically measured or ascertained from published data. See, for example, Stickney et al, *A Journal of Vacuum Science & Technology*, Vol. 4, No. 1, page 10 (1967). Curve fitting can then be used to obtain an analytic expression for the normalized distribution F for each nozzle, as a function of the angle $\phi$ from the nozzle axis, the ratio of the mean free path to the nozzle diameter $\lambda/D$ and the ratio of the nozzle length to the nozzle diameter $L/D$, e.g., $$F = F(\phi, \lambda/D, L/D)$$

The rate R, in units of mass flux, at which vapor builds upon the substrate for a nozzle with angular distribution F is $$R = CmF \cos \alpha \frac{dS}{r^2}$$

where:
m is the rate of effusion,
α is the angle between the normal of the substrate and the source,
dS is the differential receiving arc,
C is the normalization constant of distribution,
and
r is the distance from the source to dS.

C can be evaluated by integrating over a hemisphere and setting the integrated arrival rate equal to the total amount evaporated. Thus, $$C = \left[ \int_{\phi=0}^{2\pi} \int_{\theta=0}^{\pi/2} F(\theta, \lambda/D, L/D) \sin \theta d\theta d\phi \right]^{-1}$$

This constant must be evaluated for each nozzle after the pressure and mean free path are known.

For a substrate moving through the deposition zone from $y_0$ to y at a velocity V, the terminal thickness of a film with density ρ at a fixed position on the substrate is given by the relation:

$$T = \int_{y_0}^{y} \left[ \frac{1}{V\rho} CmF(\cos\alpha) r^2 \right] dy$$

This equation can be analytically or numerically integrated and the contributions for each nozzle summed to obtain the total deposition onto the position.

While the invention has been described in connection with a small number of specific embodiments, it is to be understood that these are merely illustrative of the many possible specific embodiments which can represent applications of the principles of the invention. Numerous and varied arrangements can be made by those skilled in the art without departing from the spirit and scope of the invention. Thus, for example, the invention may also be practiced for vacuum deposition of various materials such as zinc, zinc phosphide ($Zn_3P_2$), zinc sulfide (ZnS), aluminum, and silicon oxide (SiO), as well as the previously noted cadmium sulfide and zinc cadmium sulfide.

What is claimed is:

1. A method for depositing material on a continuously moving substrate in the manufacture of photovoltaic cells and the like comprising steps of:
   heating said material to the vapor state in a substantially enclosed evaporation chamber;
   conveying said material from said evaporation chamber to a manifold chamber through a restricted diameter rate controlling orifice between said evaporation chamber and said manifold chamber with said manifold chamber being in communication with a vacuum coating chamber;
   conveying said material out of said manifold chamber through a plurality of nozzles in a spaced array and from said nozzles into said vacuum chamber; and
   passing said substrate in said vacuum chamber adjacent to and spaced from said nozzles to deposit said material on said continuously moving substrate.

2. A method according to claim 1 wherein said material is deposited uniformly and with greater than 50% efficiency.

3. A method according to claim 1 wherein said pressure difference is controlled by the heat input to said evaporation chamber.

4. A method according to claim 1 wherein said material is continuously deposited on a moving substrate without breaking vacuum.

5. A method according to claim 1 wherein upon exhaustion of evaporant material in said evaporation chamber, a second chamber is operatively connected to said manifold without interrupting the vacuum in said vacuum coating chamber.

6. A method according to claim 5 wherein said operative connection of said second chamber is accomplished automatically.

7. A method according to claim 6 wherein said automatic operative connection is initiated by the temperature of said evaporation chamber.

8. A method according to claim 1 wherein the material is applied as a component in the continuous deposition of semiconductor layers for thin film solar cells.

9. A method according to claim 8 wherein said semiconductor layer is a material selected from the group consisting of cadmium sulfide and zinc cadmium sulfide.

10. A method according to claim 9 wherein said semiconductor layer is deposited for an equivalent area of solar cells sufficient to generate 1000 peak kilowatts of electricity in one year.

11. A method according to claim 9 wherein said semiconductor layer is deposited for an equivalent area of solar cells sufficient to generate 10 peak megawatts of electricity in one year.

12. A method according to claim 1 wherein the material is selected from the group consisting of cadmium sulfide, zinc cadmium sulfide, zinc, zinc phosphide, zinc sulfide, aluminum, and silicon oxide.

13. A method according to claim 1 wherein said material is deposited on only one surface of said substrate.

14. A method according to claim 1 wherein said material is deposited on only the lower surface of said substrate.

15. A method according to claim 1 wherein said material is a sublimable solid.

16. A method for depositing material on a continuously moving substrate comprising steps of:
heating said material to the vapor state in a substantially enclosed evaporation chamber;
conveying said material from said evaporation chamber to a manifold chamber through a restricted diameter rate controlling orifice between said evaporation chamber and said manifold chamber with said manifold chamber being in communication with a vacuum coating chamber;
conveying said material out of said manifold chamber through a plurality of nozzles in a spaced array and from said nozzles into said vacuum chamber; and
passing said substrate in said vacuum chamber adjacent to and spaced from said nozzles to deposit said material on said continuously moving substrate.

17. A method according to claim 16 wherein said material is deposited uniformly and with greater than 50% efficiency.

18. A method according to claim 16 wherein said pressure difference is controlled by the heat input to said evaporation chamber.

19. A method according to claim 16 wherein said material is continuously deposited on a moving substrate without breaking vacuum.

20. A method according to claim 16 wherein upon exhaustion of evaporant material in said evaporation chamber, a second chamber is operatively connected to said manifold without interrupting the vacuum in said vacuum coating chamber.

21. A method according to claim 20 wherein said operative connection of said second chamber is accomplished automatically.

22. A method according to claim 21 wherein said automatic operative connection is initiated by the temperature of said evaporation chamber.

23. A method according to claim 16 wherein the material is selected from the group consisting of cadmium sulfide, zinc cadmium sulfide, zinc, zinc phosphide, zinc sulfide, aluminum and silicon oxide.

24. A method according to claim 16 wherein said material is deposited on only one surface of said substrate.

25. A method according to claim 16 wherein said material is deposited on only the lower surface of said substrate.

26. A method according to claim 16 wherein said material is a sublimable solid.

* * * * *